United States Patent
Minowa

(10) Patent No.: US 7,103,029 B1
(45) Date of Patent: Sep. 5, 2006

(54) TRANSMITTER GAIN STABILIZING APPARATUS

(75) Inventor: Ryoichi Minowa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 264 days.

(21) Appl. No.: 09/708,116

(22) Filed: Nov. 7, 2000

(30) Foreign Application Priority Data

Jan. 31, 2000 (JP) .................................... 2000-021413

(51) Int. Cl.
  *H04B 7/216* (2006.01)

(52) U.S. Cl. .................. 370/342; 370/318; 370/441; 370/249; 375/345; 375/358; 455/24; 455/13.4; 455/69; 455/126

(58) Field of Classification Search .......... 370/342, 370/320, 335, 441, 318, 249, 250, 252; 375/135, 375/146, 295, 358, 345; 455/24, 13.4, 69, 455/126, 91, 115.1
See application file for complete search history.

(56) References Cited

U.S. PATENT DOCUMENTS

| | | | | |
|---|---|---|---|---|
| 5,056,109 A | * | 10/1991 | Gilhousen et al. | 370/342 |
| 5,485,486 A | * | 1/1996 | Gilhousen et al. | 370/335 |
| 6,057,732 A | * | 5/2000 | Morishita | 330/129 |
| 6,088,573 A | | 7/2000 | Tsuda | |
| 6,286,994 B1 | * | 9/2001 | Boesel et al. | 374/146 |
| 6,343,206 B1 | * | 1/2002 | Miya et al. | 455/69 |
| 6,628,732 B1 | * | 9/2003 | Takaki | 375/345 |
| 6,744,754 B1 | * | 6/2004 | Lee | 370/342 |
| 6,788,744 B1 | * | 9/2004 | Hirama | 375/297 |

FOREIGN PATENT DOCUMENTS

| | | |
|---|---|---|
| JP | 10-506764 | 6/1998 |
| JP | 10-336088 | 12/1998 |
| JP | 11-262055 | 9/1999 |

OTHER PUBLICATIONS

Notification of Reason(s) for Refusal dated Jun. 24, 2005.

* cited by examiner

*Primary Examiner*—Dang Ton
*Assistant Examiner*—Tri H. Phan
(74) *Attorney, Agent, or Firm*—Katten Muchin Rosenman LLP

(57) ABSTRACT

Disclosed is a transmitter gain stabilization apparatus which uses feedback control to stably control the gain of a radio base-station transmitter in a CDMA mobile communication system. The apparatus includes a reference-power generating unit for generating average power of a baseband signal as reference power, a detector for detecting transmission power, and a gain adjustment unit for adjusting the gain of a radio unit in the base station in such a manner that the detected power will coincide with the reference power.

8 Claims, 16 Drawing Sheets

FIG.12

| FIRST ATTENUATOR 53h | SECOND ATTENUATOR 53j |
|---|---|
| 0dB | 10dB |
| 1dB | 9dB |
| 2dB | 8dB |
| 3dB | 7dB |
| 4dB | 6dB |
| 5dB | 5dB |
| 6dB | 4dB |
| 7dB | 3dB |
| 8dB | 2dB |
| 9dB | 1dB |
| 10dB | 0dB |

US 7,103,029 B1

TRANSMITTER GAIN STABILIZING APPARATUS

BACKGROUND OF THE INVENTION

FIELD OF THE INVENTION

This invention relates to a transmitter gain stabilizing apparatus and, more particularly, to an apparatus for stabilizing gain in the transmitter of a radio base station of a mobile communication system using DS-CDMA (Direct Sequence Code Division Multiple Access) technology.

Mobile communication systems using DS-CDMA technology have been developed as next-generation mobile communications systems for implementing wireless multimedia communication. In such CDMA mobile communications, a base station multiplexes and transmits control information or user information by a spreading code and each of a number of mobile stations spreads and transmits information using a spreading code specified by the base station.

FIG. 13 is a diagram illustrating the structure of a CDMA transmitter of a base station for code-multiplexing and sending the transmit data of a control channel and of a plurality of user channels. The CDMA transmitter includes spread-spectrum modulators $11_1$–$11_n$ of respective control and user channels, each modulator having a frame generator 21; a serial/parallel (S/P) converter 22 for converting frame data to parallel data; and a spreading circuit 23.

The frame generator 21 includes a transmit data generator 21a for generating serial transmit data $D_1$, a pilot signal generator 21b for generating a pilot signal P, and a framing circuit 21c for forming the serial data $D_1$ into blocks a prescribed number of bits at a time and inserting the pilot signal P before and after every block to thereby form frames. The pilot signal, when all "1"s, for example, allows the receiver to recognize the amount of phase rotation caused by transmission so that the data may be subjected to a phase rotation in the opposite direction by an equivalent amount.

The S/P converter 22 alternately distributes the frame data (the pilot signals and transmit data) one bit at a time to convert the frame data to I-component (in-phase component) data $D_I$ and Q-component (quadrature-component) data $D_Q$.

The spreading circuit 23 includes a pn sequence generator 23a for generating a pn sequence (long code) specific to the base station; a short-code generator 23b for generating an orthogonal Gold code (short code) specific to the control channel or user channel; an EX-OR gate 23c for outputting a spreading code $C_1$ by taking the exclusive-OR between the long code and the short code; and EX-OR gates 23d, 23e for performing spread-spectrum modulation by taking the exclusive-ORs between the data $D_I$ and $D_Q$ (symbols) respectively, and the spreading code $C_1$.

The transmitter further includes a combiner 12i for outputting an I-component code-multiplexed signal $\Sigma V_I$ by combining the I-component spread-spectrum modulated signals $V_I$ output by the respective spread-spectrum modulators $11_1$–$11_n$ of each control channel and user channel; a combiner 12q for outputting a Q-component code-multiplexed signal $\Sigma V_Q$ by combining the Q-component spread-spectrum modulated signals $V_Q$ output by the respective spread-spectrum modulators $11_1$–$11_n$; FIR-type chip shaping filters 13i, 13q for limiting the bands of the code-multiplexed signals $\Sigma V_I$, $\Sigma V_Q$, respectively; DA converters 14i, 14q for converting the digital outputs of the respective filters 13i, 13q to analog signals; a quadrature modulator 15 for applying quadrature phase-shift keying (QPSK) modulation to the code-multiplexed signals $\Sigma V_I$, $\Sigma V_Q$ of the I and Q components and outputting the modulated signal; a transmitting circuit 16 for converting the output signal frequency to a radio frequency, applying high-frequency amplification and sending the resulting signal; and an antenna 17.

FIG. 14 is a diagram illustrating the structure of a DCMA receiver. The receiver has a diversity arrangement for combining (by maximal ratio combining) the outputs of respective branches and performing data discrimination based upon the results of combination. The receiver includes a radio unit 31 of branches B1, B2 for performing a frequency conversion (RF↕IF conversion) to convert a high-frequency signal received by an antenna 30 to a baseband signal. A quadrature detector 32 subjects the baseband signal to quadrature detection and outputs in-phase component (I-component) data and quadrature-component (Q-component) data. The quadrature detector 32 includes a receive-carrier generator 32a; a phase shifter 32b for shifting the phase of the receive carrier by $\pi/2$; and multipliers 32c, 32d for multiplying the baseband signal by the receive carrier and outputting the I- and Q-component signals. Low-pass filters (LPF) 33a, 33b limit the band of these output signals. A/D converters 35a, 35b convert the I- and Q-component signals, respectively, to digital signals and apply these signals to a searcher 36, fingers $37a_1$–$37a_4$ and a reception-power measurement unit 38.

Upon receiving input of a direct-sequence signal (DS signal) that has been influenced by the multipath effect, the searcher 36 detects multipath interference by performing an autocorrelation operation using a matched filter (not shown) and inputs despreading-start timing data and delay-time adjustment data of each path to the fingers $37a_1$–$37a_4$. A despreader/delay-time adjuster 41 of each of the fingers $37a_1$–$37a_4$ performs dump integration by subjecting a direct wave or delayed wave that arrives via a prescribed path to despread processing using a code identical with that of the spreading code, then applies delay processing that conforms to the path and outputs two types of signals, namely a pilot signal (reference signal) and an information signal. A phase compensator (channel estimation unit) 42 averages the voltages of I- and Q-components of the pilot signal over a prescribed number of slots and outputs channel estimation signals $I_t$, $Q_t$. A synchronous detector 43 restores the phases of despread information signals I', Q' based upon a phase difference θ between a pilot signal contained in the receive signal and an already known pilot signal. That is, since the channel estimation signals $I_t$, $Q_t$ are cosine and sine components of phase difference θ, the synchronous detector 43 performs demodulation (synchronous detection) of receive information signals (I,Q) by applying phase rotation processing to reception information signals (I',Q') in accordance with the following equation using the channel estimation signals $$(I_t, Q_t)$$

$$\begin{pmatrix} I \\ Q \end{pmatrix} = \begin{pmatrix} It & Qt \\ -Qt & It \end{pmatrix} \begin{pmatrix} I' \\ Q' \end{pmatrix} \quad (1)$$

A RAKE combiner 37b combines the signals output from the fingers $37a_1$–$37a_4$, a multiplier 37d multiplies the combined output of the RAKE combiner by a weighting that conforms to the reception power and outputs the weighted signal, a maximal-ratio combiner 39 combines the outputs of respective branches at a ratio that conforms to the size of reception power, and a discrimination unit 40 performs data discrimination based upon maximal ratio combining.

With DS-CDMA, all users (all channels) employ the same frequency band in communication with the base station. Consequently, in a case where mobile stations transmit to a base station, a so-called near-far problem occurs. Specifically, if a mobile station near the base station and a mobile station far from the base station transmit at the same power, the transmission power of the nearby mobile station will be more than necessary and will interfere with transmission from the other mobile station. Therefore, in the uplink for mobile-station transmission/base-station reception, the usual practice is to exercise transmission power control for controlling the transmission power of each mobile station in such a manner that reception power will be constant at the base station.

FIG. 15 is a diagram useful in describing uplink-channel closed-loop transmission power control. Here a base station 1 includes a spread-spectrum modulator 1a for spread-spectrum modulating transmit data using a spreading code conforming to a prescribed channel specified by the base station, and a power amplifier 1b for amplifying a signal, which is input thereto following processing such as orthogonal modulation and frequency conversion applied after spread-spectrum modulation, and transmitting the amplified signal to a base station 2 from an antenna. The base station 2 includes despreaders 2a of respective fingers conforming to the respective paths for applying despread processing to a delay signal that arrives via the assigned path, and a RAKE demodulator 2b for combining the signals output from the fingers, subjecting the combined signal to maximal ratio combining at a weighting conforming to the reception power of each branch, and discriminating "1"s and "0"s of the receive data based upon the maximal-ratio combination signal.

A SIR measurement unit 2c measures the power ratio (SIR: Signal Interference Ratio) of the receive signal (Signal) to an interference signal (Interference) which includes thermal noise. A comparator 2d compares the measured SIR with a target SIR, creates a command which lowers the transmission power by 1 dB using a TPC (Transmission Power Control) bit if the measured SIR is equal to or greater than the target SIR, and creates a command to raise the transmission power by 1 dB using the TPC bit if the measured SIR is less than the target SIR. The target SIR is a SIR value necessary to obtain a BER (Bit Error Rate) of, e.g., $10^{-3}$ (error generation 2b at a rate of one error per 1000). The target SIR is input to the comparator 2d from a target-SIR setting unit 2e. A spread-spectrum modulator 2f spread-spectrum modulates the transmit data and the TPC bit. After spread-spectrum modulation, the base station 2 executes processing such as D/A conversion, orthogonal modulation, frequency conversion and power amplification and transmits the results to the base station 1 from an antenna. A despreader 1c in the mobile station 1 applies despread processing to the signal received from the base station 2, and a RAKE demodulator 1d demodulates the receive data and TPC bit and controls the transmission power of the power amplifier 1b in accordance with a command specified by the TPC bit. Furthermore, in parallel with the control described above, the base station 2 controls signal level transmitted to each mobile station based upon the comparison of the measured SIR and target SIR.

The mobile station 1 and base station 2 perform the above-described transmission power control on a per-slot basis. FIG. 16(a) is a diagram useful in describing frame/slot structure of an uplink signal from the mobile station 1 to the base station 2. One frame (10 ms) is composed of 15 667-μs slots $S_0$ to $S_{14}$, each of which consists of, e.g., ten symbols. Each slot constituting a frame for an I component transmits 10 symbols of information, and each slot constituting a frame for a Q component transmits six symbols of a reference signal (pilot) and other signals. The SIR measurement unit 2c measures, slot by slot, the SIR using the six-symbol reference signal contained in each slot of the Q-component frame, and the comparator 2d creates the transmission-power control command using the TCP bit, as mentioned above, in conformity with the comparison between the measured SIR and the target SIR. The base station 2 transmits this transmission-power control command to the mobile station 1 every 667 μs, as shown in (b) of FIG. 16, and the mobile station 1 controls the transmission power in accordance with this command. Since the control cycle is $T_{slot}$=0.667 ms, control is capable of following up momentary fluctuation.

Further, with DS-CDMA, a plurality of radio base stations share the same carrier. It is therefore necessary to perform control accurately in such a manner that the transmission power of each base station will not interfere with other base stations. In addition, since the radio unit of the radio base station is constructed of analog components, the gain thereof varies depending upon differences in characteristics, temperature and changes with time. This makes it necessary to stabilize gain so that it will be independent of differences in characteristics, temperature and changes with time.

In conventional communication systems other than a CDMA-based system, a specified transmission power is given for every carrier and therefore gain control, i.e., control of transmission power, is carried out by detecting transmission output and forming a feedback loop in such a manner that the output of the detector will be equal to the specified transmission power. With a CDMA communication system, however, the specified transmission power is not fixed as in the case of conventional communication systems but varies depending upon the number of users (number of channels) multiplexed and the transmission power of each user. As a consequence, the CDMA transmitter of a conventional base station does not perform gain stabilization based upon a feedback loop but seeks to stabilize transmission power by way of temperature compensation of the radio unit.

FIG. 17 is a block diagram illustrating an example of a radio unit having a temperature compensation circuit. The circuit includes a frequency converter 16a for up-converting a baseband signal, which is output from the quadrature modulator 15, to an RF signal; a level control circuit 16b such as variable attenuator or variable amplifier (the former in this example) for varying the level of the RF signal output from the frequency converter; a temperature compensation circuit 16c for inputting an output-power correction signal that conforms to the temperature of the radio unit to the variable attenuator; and a power amplifier 16d for amplifying the signal output from the variable attenuator and inputting the amplified signal to the antenna 17. If, as shown in FIG. 18, the radio unit outputs a power $L_0$ at ordinary temperature $t_0$ and has a temperature characteristic in which the output level varies due to temperature in a manner indicated by the solid line, it will suffice to control the attenuation (gain) of the level control circuit 16b in the manner indicated by the dashed line to render the output power $L_0$ constant regardless of temperature. Accordingly, the temperature compensation circuit 16c stores the correspondence between temperature and attenuation in an internal temperature compensation table in advance, finds the attenuation that conforms to the present ambient temperature from this table and inputs this attenuation to the variable attenuator 16*b* to exercise control in such a manner that a constant output will be obtained irrespective of temperature. To this end, the temperature compensation circuit 16*c* is provided with a temperature compensation table 16*c*-1, a temperature detector 16*c*-2, an A/D converter 16*c*-3 and a level controller 16*c*-4.

However, with the method of gain stabilization based upon temperature compensation, highly precise control cannot be performed owing to individual differences in the elements constituting the radio unit. Another problem is that such control is not effective against change with time. For this reason, there is a need to stabilize transmitter gain by a feedback loop based upon a reference transmission power in a manner similar to that of conventional wireless systems even in a radio base-station transmitter of a CDMA mobile communication system.

SUMMARY OF THE INVENTION

Accordingly, an object of the present invention is to control the gain in a radio base-station transmitter of a CDMA wireless communication system stably by feedback control.

Another object of the present invention is to stabilize the gain of a radio base-station transmitter in highly precise fashion.

According to the present invention, the foregoing objects are attained by providing an apparatus for stabilizing gain of a transmitter comprising the following provided in a CDMA transmitter of a base station: (1) first averaging means for outputting an average power value of a transmission baseband signal; (2) a radio unit, to which the transmission baseband signal is input, for applying modulation, frequency conversion and high-frequency amplification to the baseband signal; (3) a transmission power detector for detecting power of a transmission signal output from the radio unit; (4) second averaging means for outputting an average value of the detected transmission power; and (5) a first gain adjustment unit for comparing the average power of the baseband signal and the detected transmission power that have been output from the first and second averaging means, respectively, and adjusting the gain of the radio unit based upon the result of the comparison.

In the CDMA transmitter of the base station, the transmission baseband signal is the result of combining the spread signals of respective channels (control and user channels). This signal is obtained by digital processing and is independent of changes in temperature, change with time and difference in characteristics. The radio unit, on the other hand, is implemented by analog components and its gain and, hence, its transmission power, varies depending upon changes in temperature, change with time and difference in characteristics. Accordingly, transmission power is detected by the transmission power detector and the first gain adjustment unit adjusts the gain of the radio unit in such a manner that the detected transmission power will agree with a reference power which is the average power of the transmission baseband signal. More specifically, the first gain adjustment unit calculates the average of the difference between the reference power and the transmission power and adjusts the amplitude value of the transmission baseband signal based upon the average of this difference to thereby control the gain of the radio unit.

Thus, the gain of the radio base-station transmitter can be stabilized in highly precise fashion by feedback control. In addition, by averaging the power value of the transmission baseband signal and the detected transmission power value and the result of the power comparison, it can be so arranged that these will not follow up an increase or decrease in number of users and a variation in the transmission power of each user. This makes possible highly precise gain control.

Further, the apparatus for stabilizing transmitter gain according to the present invention includes means for comparing the average value of the baseband signal with a set value and halting gain stabilization control when the average power is smaller than the set value. Since the dynamic range of transmission power in the CDMA transmitter of a base station can reach 50 dB, the number of bits for expressing the power value is large and results in a circuit of large scale. Though the number of bits for expressing power should be reduced to prevent such an increase in circuit size, a fewer number of bits leads to an error in expressing power at the time of low-power transmission. Accordingly, gain stabilization control is halted at the time of low-power transmission when the average power of the baseband signal is smaller that the set value. This makes it possible to prevent a decline in precision of gain control while preventing an increase in the scale of the circuitry.

The apparatus for stabilizing transmitter gain according to the present invention further includes adjusted-gain cancellation means so adapted that when the gain of the radio unit has been adjusted by a second gain adjustment unit provided in the radio unit, the cancellation means does not allow this adjusted gain to be reflected in the result of the comparison performed by the first gain adjustment unit. A transmission power amplifier is connected to the radio unit and the transmission signal is power amplified and broadcast from the antenna. The gain characteristic of this transmission power amplifier differs for each base station transmitter. In order to diminish the influence of this difference in gain characteristics, transmission power is finely adjusted in the second gain adjustment unit. The apparatus for stabilizing transmitter gain operates so as to cancel out the change in gain due to such fine adjustment and the end result is that the fine adjustment is nullified. Accordingly, the adjusted-gain cancellation means corrects the detected transmission power value by the amount of the adjusted gain in a direction opposite the adjustment direction and feeds back the adjusted value. Alternatively, the adjusted-gain cancellation means corrects the reference power of the feedback loop by the amount of the adjusted gain in a direction the same as the adjustment direction. As a result, the adjusted gain in the second gain adjustment unit is not cancelled out by feedback control. Moreover, a fluctuation in gain caused by temperature change and change with time of the radio unit can be stabilized by feedback control.

The apparatus for stabilizing transmitter gain according to the present invention further includes detected-power correction means for correcting detection error, which is included in the transmission power detected by the transmission power detector, based upon average power value and peak power value of the baseband signal. The transmission power value detected by the transmission power detector includes a detection error conforming to the crest factor (the ratio of average power to peak power) of the transmission signal. Accordingly, the apparatus for stabilizing transmitter gain according to the present invention measures detection errors conforming to combinations of average power values and peak power values in advance, arranges these detection errors in the form of a table, detects the average power value and peak power value of the baseband signal, reads the detection error conforming to the detected average power value and peak power value from the table and, on the basis of this detection error, corrects the transmission power value detected by a detector. As a result, detection error can be corrected in accordance with the crest factor and highly precise gain stabilization control can be carried out.

The apparatus for stabilizing transmitter gain according to the present invention further includes means for outputting a transmission-power abnormality signal in a case where a difference between the average power of the baseband signal and the detected transmission power is greater than a set level. The transmission power of a CDMA transmitter varies depending upon the number of users and transmission power of each user. As a consequence, whether or not an abnormality has developed in the transmission output cannot be determined solely from the detected transmission power value. Accordingly, the apparatus for stabilizing transmitter gain according to the present invention finds the difference between the average power of the baseband signal as the reference power value and detected transmission power value and determines that the transmission output is abnormal when the difference exceeds a threshold value. If this arrangement is adopted, a transmission output abnormality can be detected in reliable fashion.

Other features and advantages of the present invention will be apparent from the following description taken in conjunction with the accompanying drawings.

BRIEF DESCRIPTION OF THE DRAWINGS

FIG. 12 is a table useful in describing amounts of attenuation of respective attenuators;

DESCRIPTION OF THE PREFERRED EMBODIMENTS (A) Overview of the Invention

Figure 1:
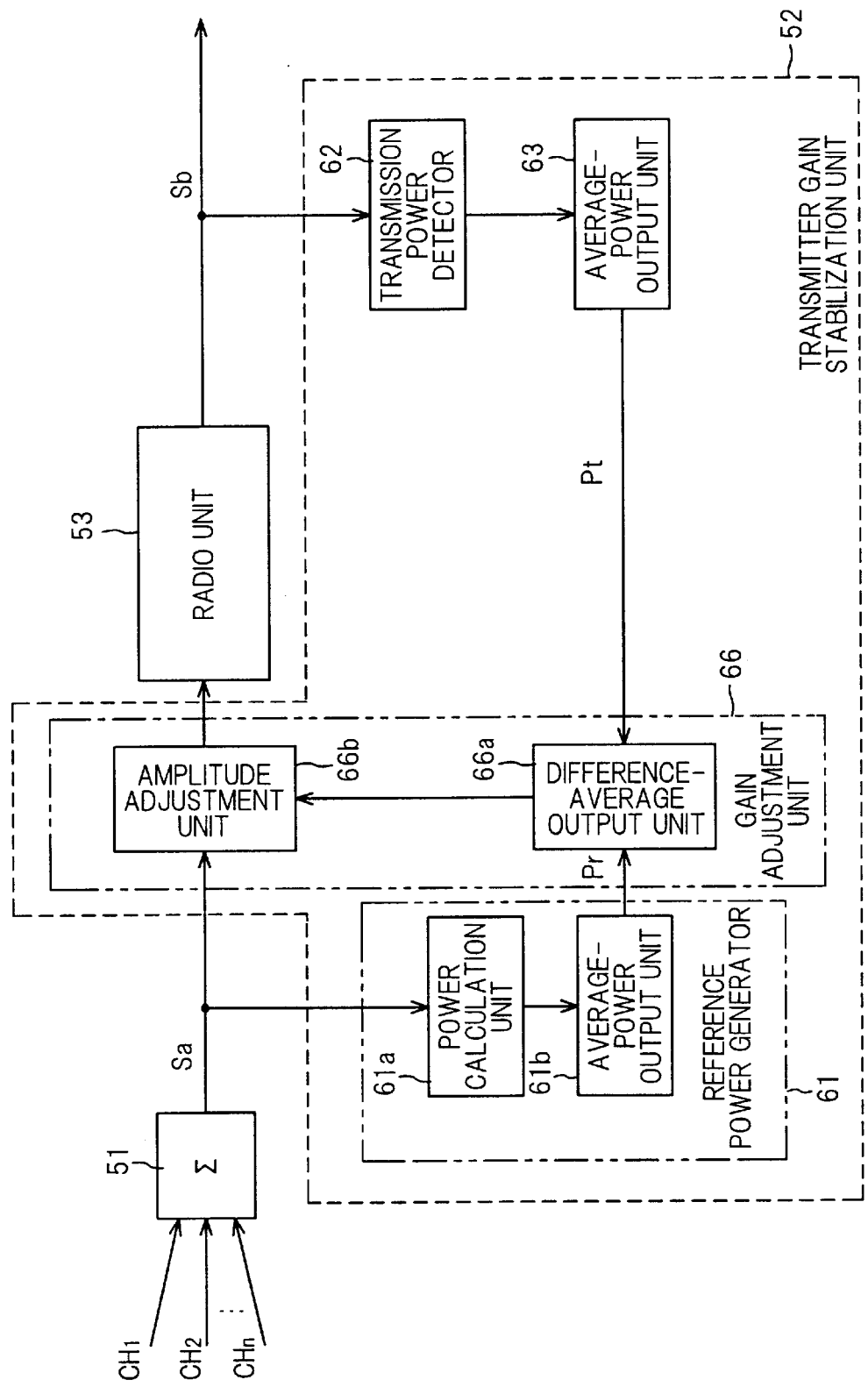
FIG. 1 is a block diagram useful in describing an overview of the present invention.

FIG. 1 is a block diagram illustrating the structure of a base-station CDMA transmitter having a transmitter gain stabilization unit 52 according to the present invention. Shown in FIG. 1 are a multiplexed signal generating unit 51 for generating a transmission baseband signal Sa by adding spread data of respective ones of channels $CH_1$ to $CH_n$. This unit corresponds to the combiners 12i, 12q of FIG. 13. The transmission baseband signal Sa is input to a radio unit 53, which subjects this signal to modulation, frequency conversion and high-frequency amplification and outputs a transmission signal Sb as a result.

The transmitter gain stabilization unit 52 includes a reference power generator 61 having a power calculation unit 61a for calculating the power of the transmission baseband signal Sa and outputting the result, and an average-power output unit 61b for calculating the average power of the transmission baseband signal Sa and outputting the average power as a reference power Pr. The transmitter gain stabilization unit 52 further includes a transmission power detector 62 for detecting the power of the transmission signal Sb output by the radio unit 53; an average-power output unit 63 for outputting an average value Pt of the detected transmission power; and a gain adjustment unit 66 for comparing the reference power Pr output from the average-power output unit 61b with the detected transmission power Pt output from the average-power output unit 63. The gain adjustment unit 66 has a difference-average output unit 66a for outputting the average of the difference between the reference power Pr and the detected transmission power Pr, and an amplitude adjustment unit 66b for adjusting the amplitude value of the transmission baseband signal Sa based upon the difference average.

The transmission baseband signal Sa output from the multiplexed signal generating unit 51 is the result of combining the spread signals of respective channels and, since it is obtained by digital processing, the signal is independent of changes in temperature, change with time and difference in characteristics. The radio unit 53, on the other hand, is implemented by analog components such as a D/A converter, QPSK modulator, frequency converter and high-frequency amplifier. As a consequence, the gain of the radio unit 53 and, hence, the transmission power, varies depending upon changes in temperature, change with time and difference in characteristics. Accordingly, the gain adjuster 66 of the transmitter gain stabilization unit 52 adopts the average power of the transmission baseband signal Sa output from the multiplexed signal generating unit 51 as the reference power Pr, the transmission power Pt is detected by the transmission power detector 62 and the gain adjuster 66 adjusts the gain of the radio unit 53 in such a manner that the detected transmission power Pt will agree with the reference power Pr. More specifically, the difference-average output unit 66a in the gain adjustment unit 66 calculates the average of the difference between the reference power Pr and transmission power Pt and the amplitude adjustment unit 66b adjusts the amplitude value of the transmission baseband signal Sa based upon the difference average to thereby control the gain of the radio unit 53.

Thus, the gain of the radio unit 53 in the radio base-station transmitter can be stabilized in highly precise fashion by feedback control. In addition, by averaging the power value of the transmission baseband signal and the detected transmission power value and the result of the power comparison, it can be so arranged that these values will not follow up an increase or decrease in number of users and a variation in the transmission power of each user. This makes possible highly precise gain control.

(B) First Embodiment

Figure 2:
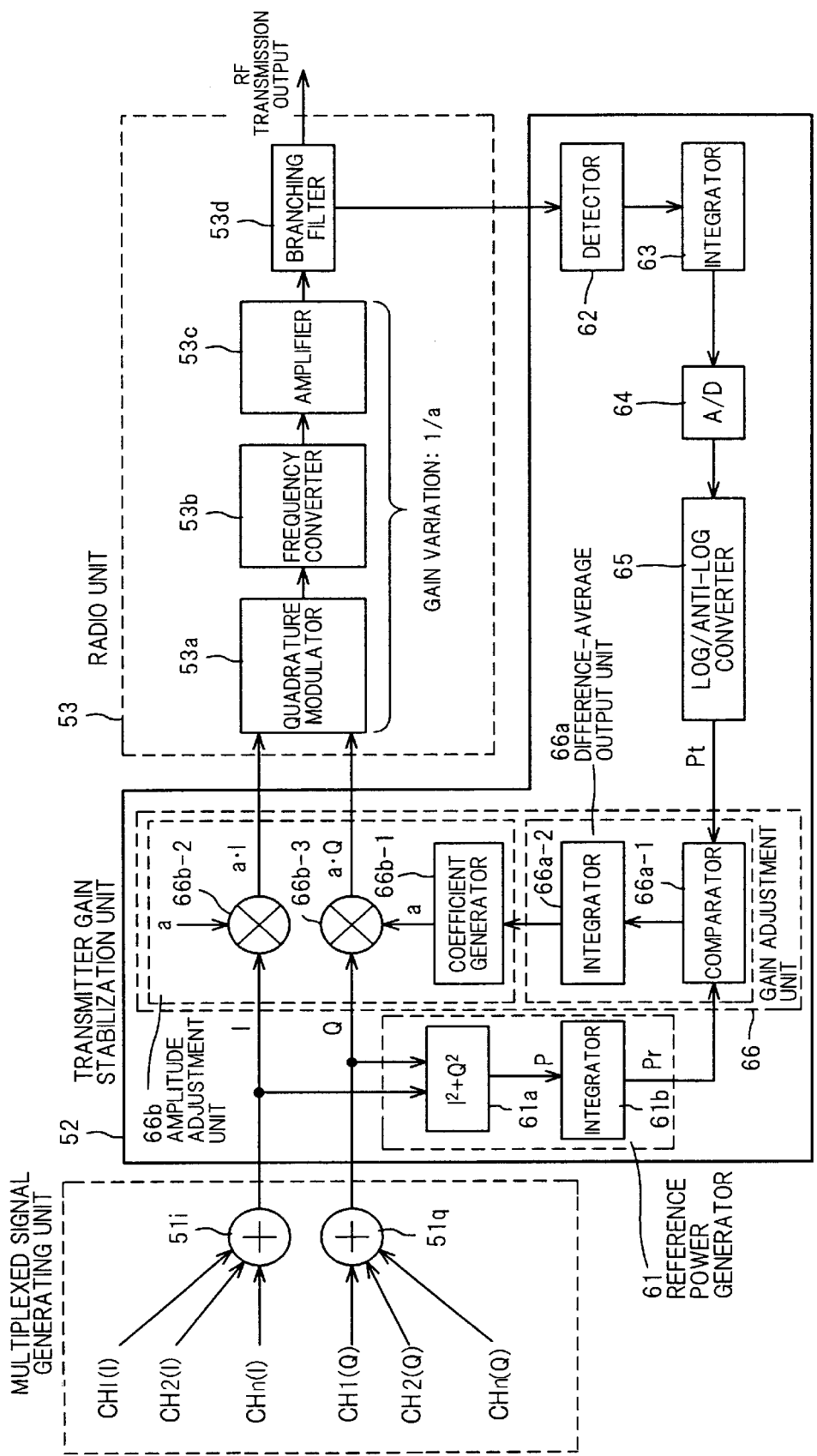
FIG. 2 is a block diagram showing the principal components of a CDMA transmitter having a transmitter gain stabilization unit according to a first embodiment.

FIG. 2 is a block diagram showing the principal components of a CDMA transmitter having a transmitter gain stabilization unit according to a first embodiment. Components in FIG. 2 identical with those shown in FIG. 1 are designated by like reference characters.

As shown in FIG. 2, the multiplexed signal generating unit 51 has a combiner 51i for combining in-phase components $CH_1(I)$, $CH_2(I)$, ..., $CH_n(I)$ of transmit data that has been spread by respective spreading units for each of the control and user channels, and a combiner 51q for combining quadrature components $CH_1(Q)$, $CH_2(Q)$, ..., $CH_n(Q)$ of the transmit data. The reference power generator 61 of the transmitter gain stabilization unit 52 has the power calculation unit 61a for calculating the power P of the transmission baseband signal Sa (=I+jQ) in accordance with the following equation:

$$P = I_2 + Q_2 \quad (2)$$

and the average-power output unit 61b, which is constituted by an integrator, for calculating the average power of the transmission baseband signal and outputting the average power as the reference power Pr. The difference-average output unit 66a of the gain adjustment unit 66 includes a comparator 66a-1 for comparing the magnitudes of the reference power Pr and detected transmission power Pt, and an integrator 66a-2 for outputting the average of the difference between the reference power Pr and detected transmission power Pt. The amplitude adjustment unit 66b has a coefficient generator 66b-1 for generating a coefficient a that conforms to the average value of the power difference, and multipliers 66b-2, 66b-3 for multiplying the in-phase component I and quadrature component Q, respectively, of the transmission baseband signal Sa by the coefficient a to thereby control the gain of the radio unit 53.

The transmission power detector 62, which detects the power of the send signal Sb output from the radio unit 53, uses a log amplifier for outputting the detected power in the form of a logarithm. The dynamic range of the transmission baseband signal Sa is a broad 50 dB. If the detected power is expressed linearly in this broad dynamic range, the number of bits required in an A/D converter 64 after detection will be too large. Accordingly, a logarithmic amplifier which outputs the detected power in the form of a logarithm is used as the detector 62 to reduce the number of bits. The integrator 63 serving as the average-power output unit averages the detected power, and a log/anti-log converter 65 converts the A/D-converted detected output value, which is expressed as a logarithm, to an anti-logarithm and inputs the latter to the gain adjustment unit 66.

The radio unit 53 includes a quadrature modulator 53a, to which the I and Q components of the baseband signal are input, for applying QPSK quadrature modulation; a frequency converter 53b for up-converting the frequency of the quadrature-modulated baseband signal to a radio frequency; an amplifier 53c for amplifying the high-frequency signal; and a branching filter 53d for branching part of the high-frequency signal, which is output from the amplifier 53c, to the detector 62. It should be noted that the quadrature modulator 53a includes an internal A/D converter for converting the I, Q components of the transmission baseband signal to analog signals.

A variation in the gain of the CDMA transmitter is caused by the analog elements used in the quadrature modulator 53a, high-frequency converter 53b, amplifier 53c which construct the radio unit 53. In other words, because of the analog structure of the radio unit 53, the gain thereof varies owing to temperature change, change with time and differences in characteristics, etc. The result is fluctuation of the transmission signal level.

However, since the I, Q components of the transmission baseband signal input to the radio unit 53 are digital signals, they are not susceptible to the effects of gain fluctuation. Accordingly, the power of the baseband signal can be averaged and the average power can be decided on as the reference power Pr. A feedback loop is formed in such a manner that the reference power Pr will coincide with the transmission power, and it is possible to stabilize, at a high precision, the gain of the radio unit 53 by feedback control.

The combiners 51i, 51j of the multiplexed signal generating unit 51 combine, for the I, Q components, transmit data $CH_1(I)+jCH_1(Q)$, $CH_2(I)+jCH_2(Q)$, ..., $CH_n(I)+jCH_n(Q)$ of each of the users. The multipliers 66b-2, 66b-3 of the gain adjustment unit 66 multiply the combined data I, Q, respectively, by the coefficient a for gain adjustment and input the products to the radio unit 53. The quadrature modulator 53a of the radio unit 53 quadrature modulates the I, Q data multiplexed by the multiplexed signal generating unit 51, the frequency converter 53b up-converts the quadrature-modulated output signal to a radio frequency, and the amplifier 53c amplifies the signal to the required transmission level.

If the change in the gain of the radio unit 53 is 1/a, then, in order to compensate for this, it is necessary for the transmitter gain stabilization unit 52 to find a coefficient that is a times this change and input this coefficient to the multipliers 66b-2, 66b-3. The branching filter 53d provided as the final stage of the radio unit 53 branches part of the transmission signal and inputs the branched output to the detector 62. The latter outputs a voltage, which conforms to the transmission power, in the form of a logarithm, the integrator 63 integrates and averages the output (transmission power) of the detector 62, and the A/D converter 64 converts the averaged detected power to a digital signal.

The power calculation unit 61a of the reference power generator 61 finds the power P of the transmission baseband signal Sa (=I+jQ) by the calculation of represented by Equation (2), and the integrator constituting the average-power output unit 61b integrates and averages the power P and outputs the average power as the reference power Pr.

The gain adjustment unit 66 compares the output of the detector 62, namely the output value (detected power Pt) of the A/D converter 64, with the reference power Pr and integrates the decision resulting from the comparison to thereby change the coefficient a output from the coefficient generator 66b-1. In this case, whereas the reference power value Pr is expressed as an anti-logarithm, the transmission power value Pt output from the A/D converter 64 is expressed as a logarithm. As a consequence, the log/anti-log converter 65 converts the transmission power value Pt output from the A/D converter 64 to an anti-logarithm, and the comparator 66a-1 subsequently compares the magnitudes of the reference power value Pr and transmission power value Pt. On the basis of the comparison, the integrator 66a-2 averages and outputs the power difference between the reference power value Pr and transmission power value Pt.

Figure 15:
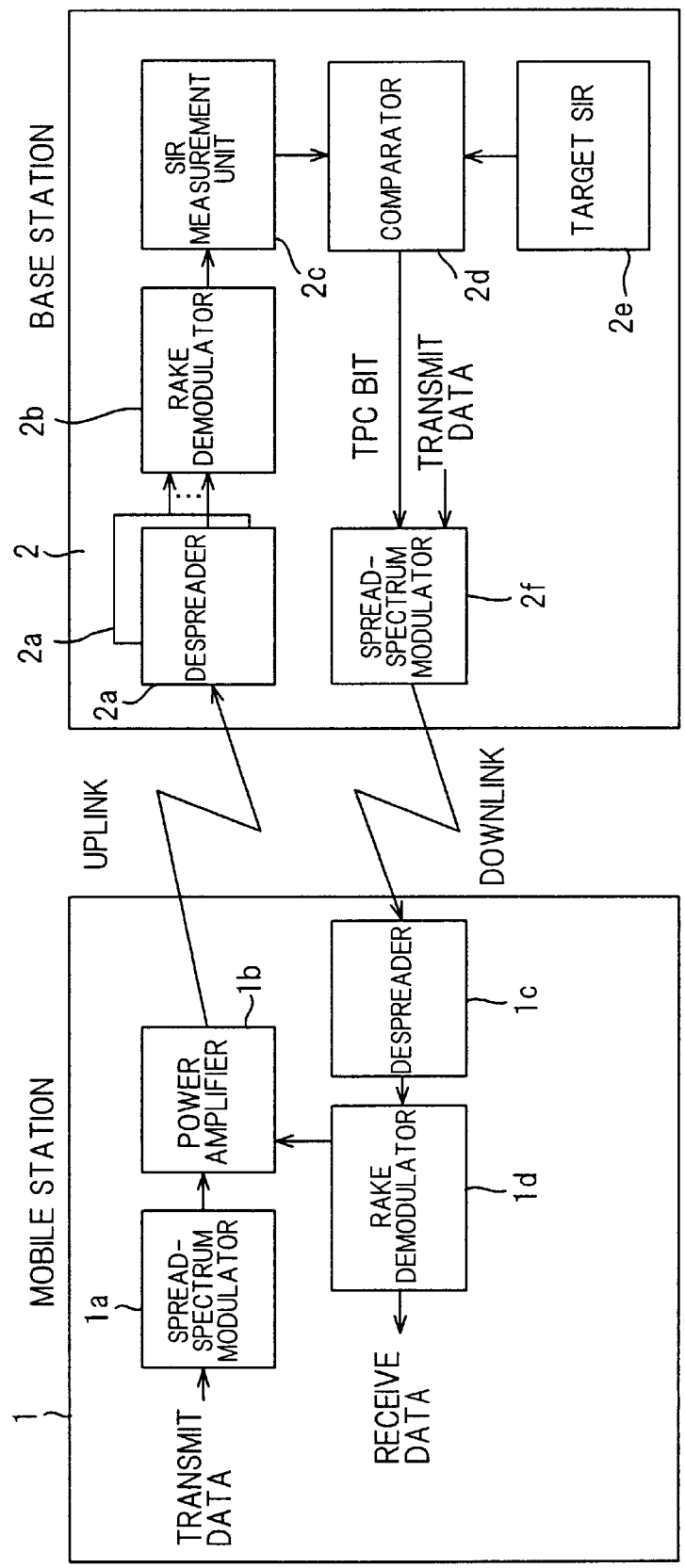
FIG. 15 is a block diagram useful in describing uplink-channel closed-loop transmission power control according to the prior art.
Figure 16:
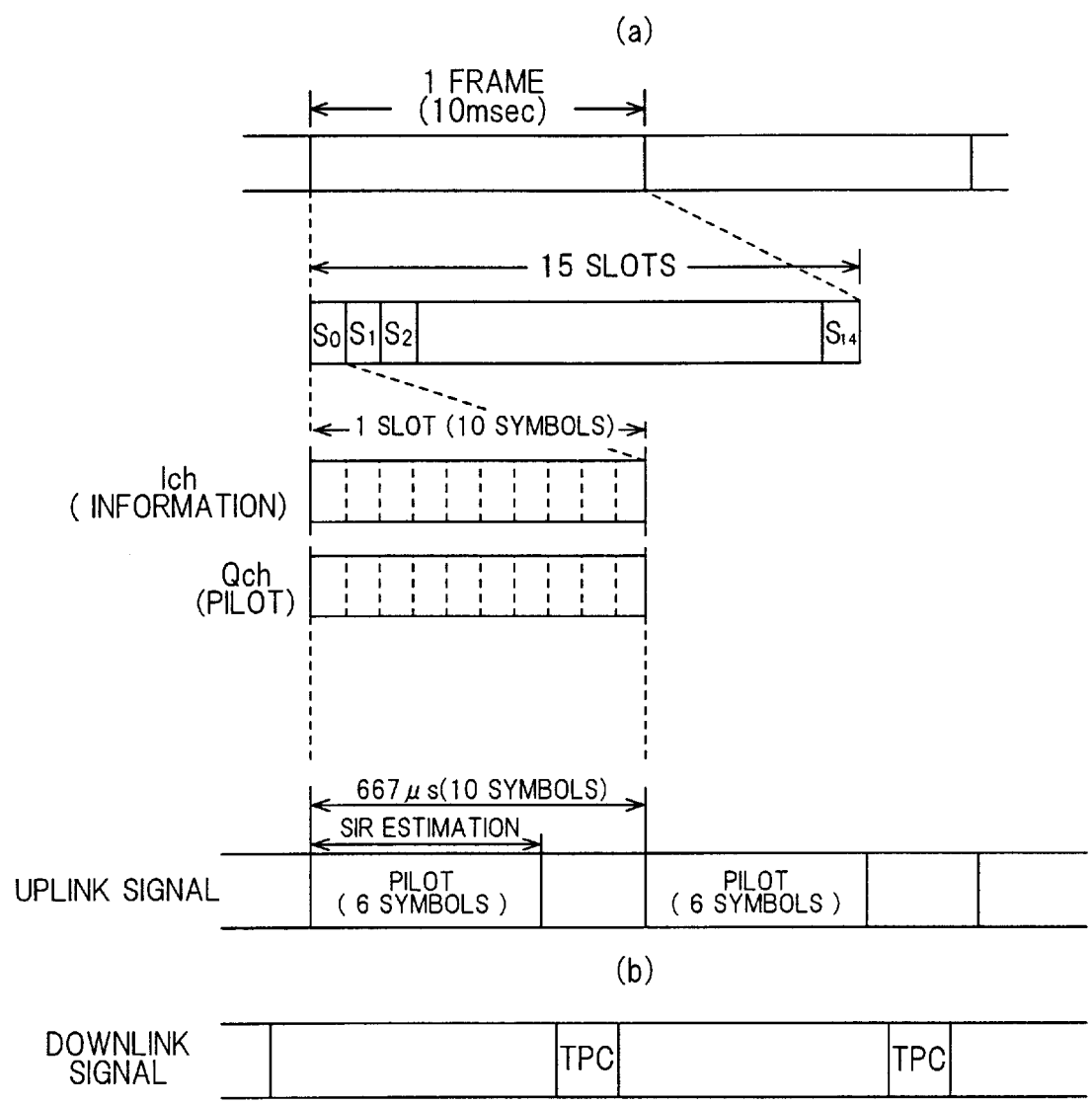
FIG. 16 is a diagram showing frame/slot structure according to the prior art.
Figure 17:
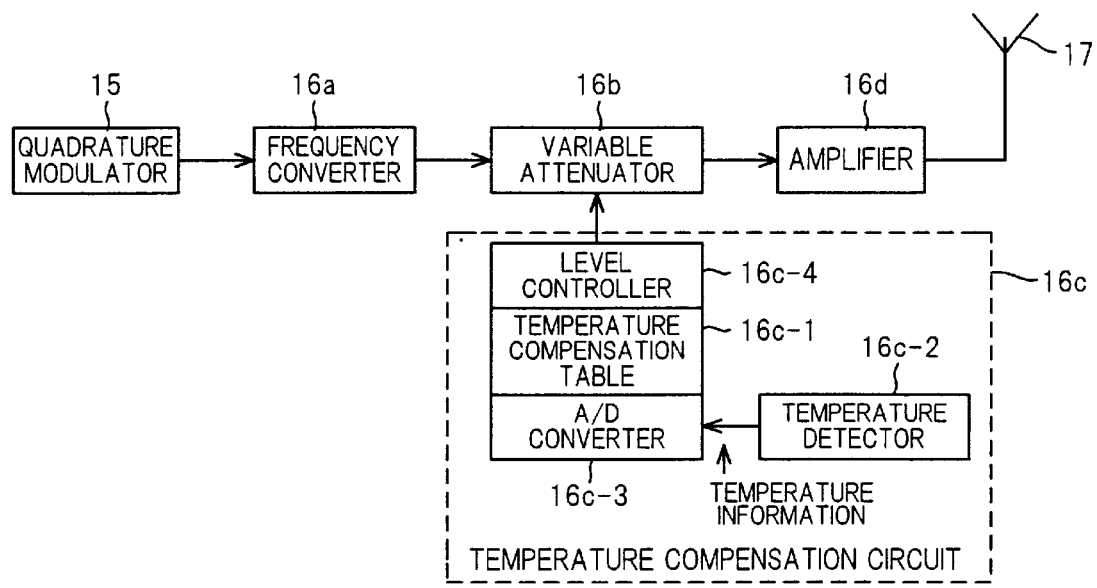
FIG. 17 is a block diagram illustrating an example of a radio unit having a temperature compensation function according to the prior art.
Figure 18:
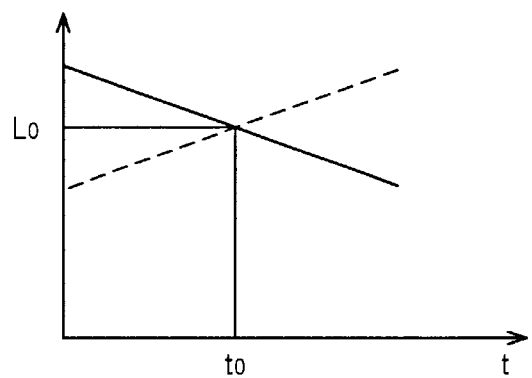
FIG. 18 is a diagram useful in describing the operation of a temperature compensation circuit according to the prior art.

It is necessary that the integration ranges (integration times) of the integrators 61b, 63 serving as the averaging means be set in such a manner that the reference power Pr and detected power Pt will not instantaneously follow up an increase or decrease in number of users or a variation in the transmission power of each user. Further, it is necessary that the integration times be set in such a manner that the reference power Pr and detected power Pt will not contain an error due to a shift in the timing of transmission power control from user to user. In the case of a CDMA communication system, the transmission power of each user is subjected to up/down transmission-power control in a maximum range of 25 dB in steps of 1 dB per time slot (667 µs) (see FIGS. 15 and 16). This suppresses the transmission power of each user to the minimum power necessary for communication and is carried out in order to increase the number of accommodated users. Though the transmission power control cycle of each user is the same, the transmit timing of the TPC (Transmission Power Control) data has an offset for each user. Accordingly, in a case where the calculated value of baseband power is found at predetermined transmission power control cycles, a calculation error occurs. To prevent this calculation error, the transmitter gain stabilization unit 52 of the present invention integrates and averages the results of baseband power calculation and the output of the detector, respectively (sets the integration times to be equal in both directions). It is required that integration time be at least one time slot, i.e., the maximum time necessary for all users to update transmission power, taking into consideration the above-mentioned transmission-timing offset.

The integrator 66a-2 is provided so that an increase or decrease in number of users or a variation in the transmission power of each user will not be followed up instantaneously. However, the integration time thereof is decided by the set-up conditions of the radio unit 53. The transmitter gain stabilization unit 52 is for compensating for a fluctuation in transmission power caused by a temperature change and change with time of the radio unit 53 and therefore sets an integration time that makes it possible to follow up satisfactorily a change in the temperature of the radio unit 53.

The output of the coefficient generator 66b-1 is controlled so that it will change gradually toward a, which is the convergence value. A change Δa in the coefficient is the final control error of the transmitter gain stabilization unit 52. By setting the change Δa to be sufficiently small, the transmitter gain can be stabilized accurately.

Figure 3:
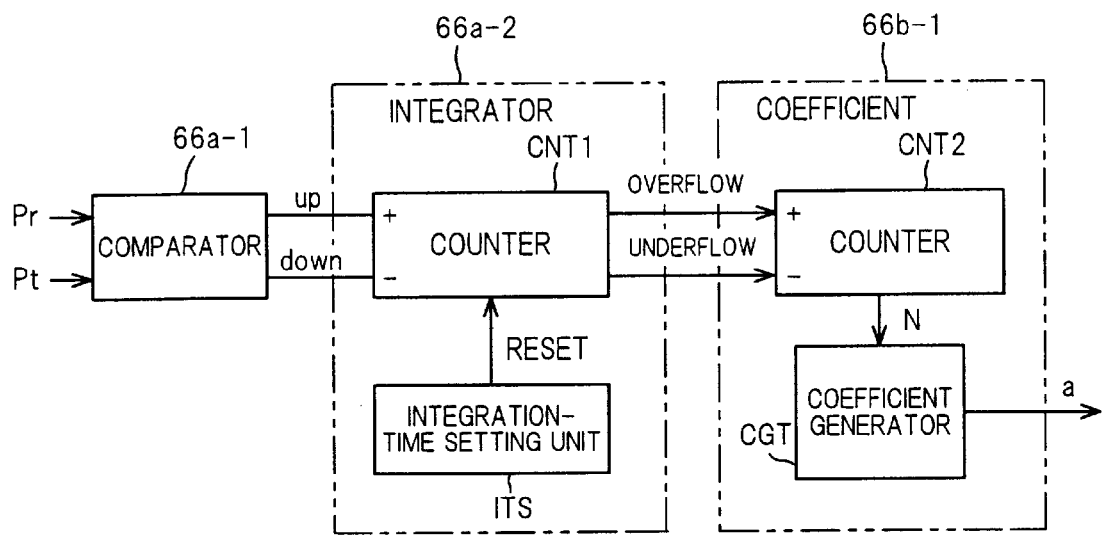
FIG. 3 is block diagram showing an embodiment of an integrator and coefficient generator.

FIG. 3 is block diagram showing an embodiment of the integrator 66a-2 and coefficient generator 66b-1. The comparator 66a-1 compares the magnitudes of the reference power Pr and transmission power Pt, outputs an up signal "up" if Pr>Pt holds and outputs a down signal "down" if Pr≦Pt holds. The integrator 66a-2 has a divide-by-M reversible counter CNT1. The latter increments its count by the up signal "up" and decrements its count by the down signal "down". The counter CNT1 outputs an overflow signal when the value of the count becomes M and outputs a underflow signal when the count N becomes −M. Further, the reversible counter CNT1 resets its count to zero in response to a reset signal RST generated by an integration-time setting unit ITS at intervals equal to the integration time. A reversible counter CNT2 in the coefficient generator 66b-1 increments its count N whenever the overflow signal is generated and decrements its count N whenever the underflow signal is generated. A coefficient generator CGT generates the coefficient a, which conforms to the count N. That is, the coefficient generator CGT generates the coefficient a, which corresponds to 0.2×N (dB), thereby controlling gain in increments of 0.2 dB.

Figure 4:
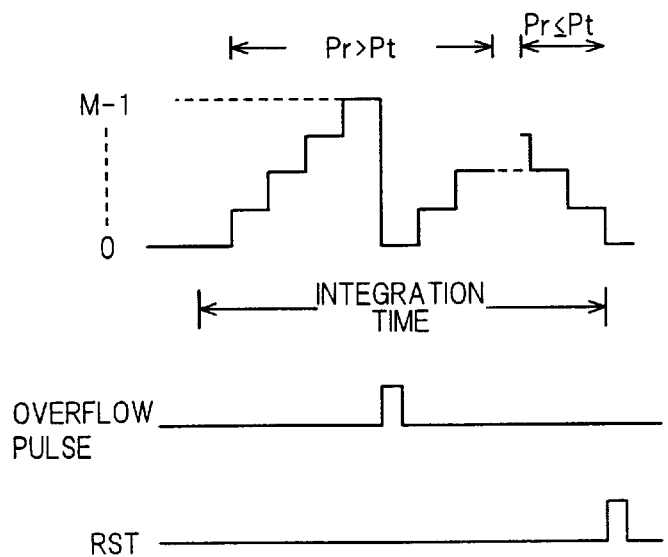
FIG. 4 is a diagram useful in describing operation of the integrator.

The count in counter CNT1 rises in steps if Pr>Pt holds and falls in steps Pr≦Pt holds, as shown in FIG. 4. If the number of up signals becomes larger than the number of down signals by M, an overflow pulse is generated, the count N in counter CNT2 is incremented and the coefficient generator CGT inputs the coefficient a, which is equivalent to 0.2×N (dB), to the multipliers 66b-2, 66b-3. The counter CNT1 thenceforth adds the up signals starting from zero and subtracts the down signals.

If the number of down signals becomes larger than the number of up signals by M, an underflow pulse is generated, the count N in counter CNT2 is decremented and the coefficient generator CGT inputs the coefficient a, which is equivalent to 0.2×N (dB), to the multipliers 66b-2, 66b-3. The counter CNT1 thenceforth adds the up signals starting from zero and subtracts the down signals.

When the integration time is attained, the reset pulse RST is generated, the count in counter CNT1 is reset to zero and the above-described operation is repeated for the next integration time period.

Thus, the gain of the radio unit in the radio base-station transmitter can be stabilized in a highly precise manner by feedback control. In addition, by averaging the power value of the transmission baseband signal and the detected transmission power value and the result of the power comparison, it can be so arranged that these values will not follow up an increase or decrease in number of users and a variation in the transmission power of each user. This makes possible highly precise gain control.

(C) Second Embodiment

Figure 5:
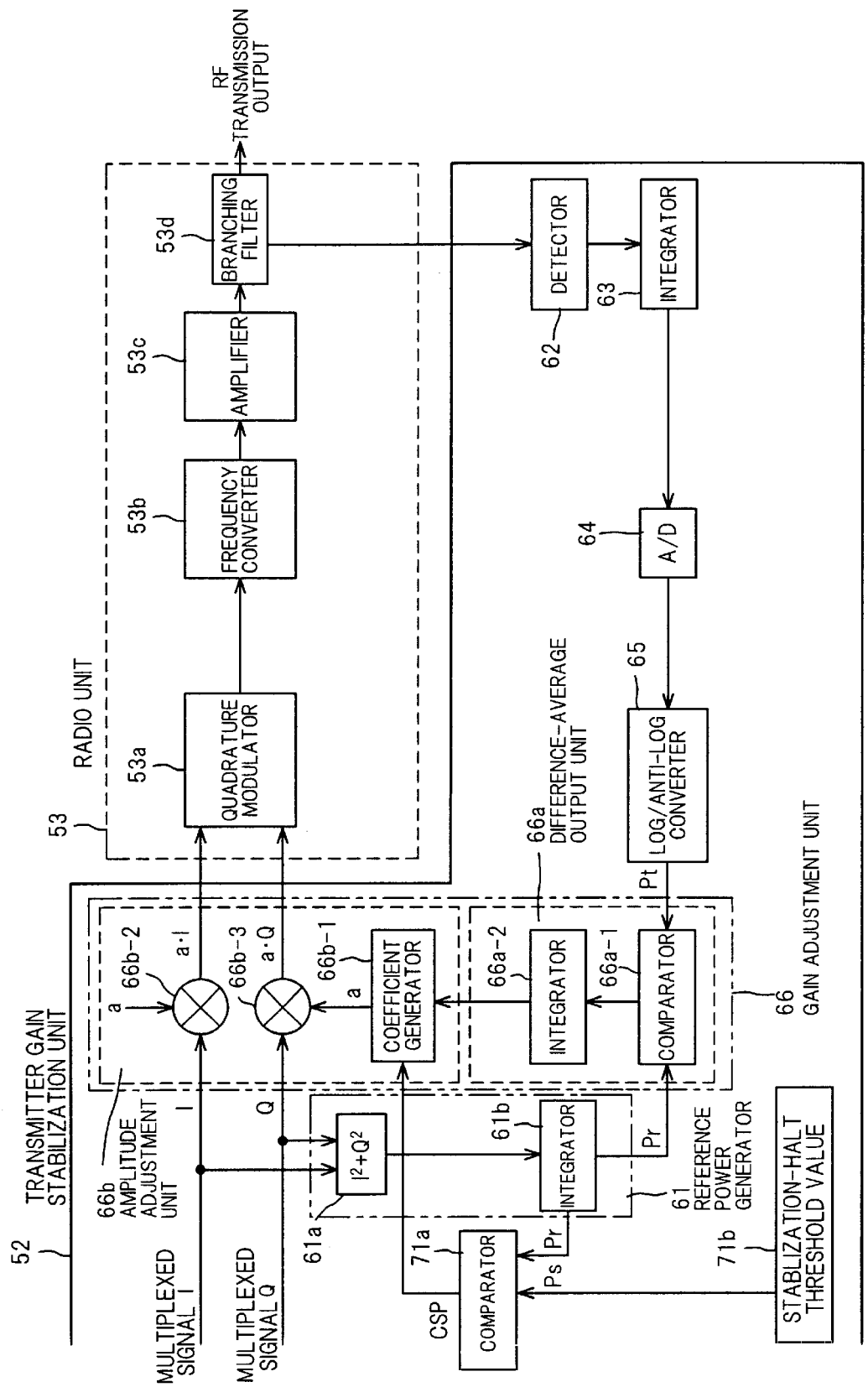
FIG. 5 is a block diagram showing the principal components of a CDMA transmitter having a transmitter gain stabilization unit according to a second embodiment.

FIG. 5 is a block diagram showing the principal components of a CDMA transmitter having a transmitter gain stabilization unit according to a second embodiment. Components in FIG. 5 identical with those shown in FIG. 2 are designated by like reference characters. This embodiment differs in that:

(1) a comparator 71a is provided for comparing the magnitudes of the reference power Pr and a set power (a threshold value for halting stabilization) Ps;

(2) a setting unit 71b is provided for setting the set power Ps; and (3) the multiplexed signal generating unit 51 is not shown in FIG. 5.

Since the dynamic range of transmission power in the CDMA transmitter of a base station can reach 50 dB, the number of bits for expressing the power value is large and results in a circuit of large scale. Though the number of bits for expressing power should be reduced to prevent such an increase in circuit size, a fewer number of bits leads to an error in expressing power at the time of low-power transmission. Accordingly, in the second embodiment, gain stabilization control is halted at the time of low-power transmission when the average power of the baseband signal is smaller that the set power (the threshold value for halting stabilization) Ps. Specifically, the comparator 71a compares the magnitudes of the average power (reference power) Pr of the transmission baseband signal output from the integrator 61b and the set power Ps and inputs a coefficient-stabilization halt signal CSP to the coefficient generator 66b-1 if Pr<Ps holds. Upon receiving the input of the coefficient-stabilization halt signal CSP, the coefficient generator 66b-1 stops updating the coefficient. In other words, the counter CNT2 (see FIG. 3) stops the coefficient of the overflow/underflow pulses and stops updating the coefficient.

Thus, in accordance with the second embodiment, gain stabilization control is halted at the time of low-power transmission. This makes it possible to prevent a decline in the precision of gain control while preventing an increase in the scale of the circuitry.

(D) Third Embodiment

Figure 6:
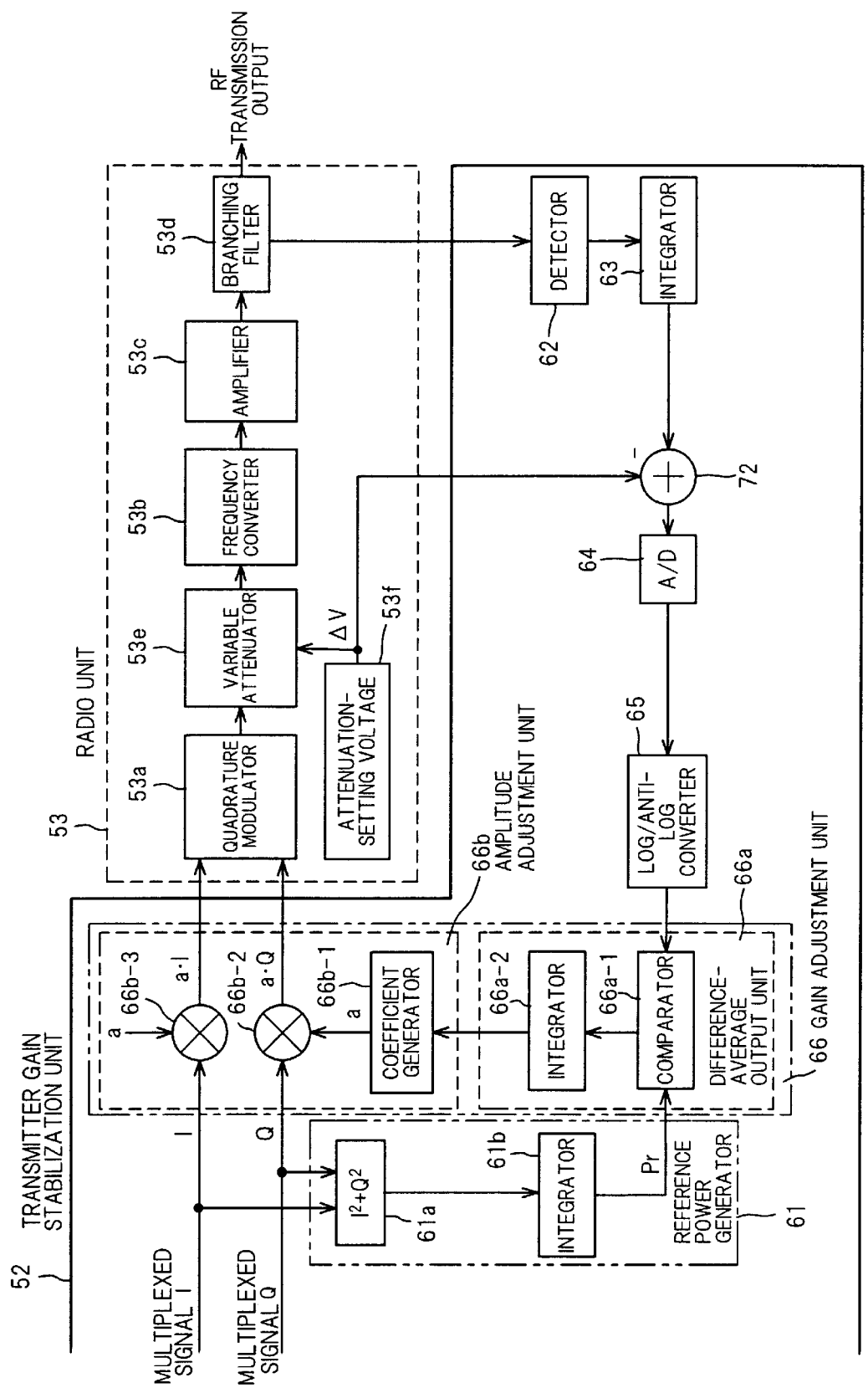
FIG. 6 is a block diagram showing the principal components of a CDMA transmitter having a transmitter gain stabilization unit according to a third embodiment.

FIG. 6 is a block diagram showing the principal components of a CDMA transmitter having a transmitter gain stabilization unit according to a third embodiment. Components in FIG. 6 identical with those shown in FIG. 2 are designated by like reference characters. This embodiment differs in that:

(1) there are provided a variable attenuator 53e for controlling the gain within the radio unit 53 and an attenuation-setting voltage generator 53f for setting the amount of attenuation in the variable attenuator 53e; and (2) adjusted-gain cancellation means 72 is provided so that when the gain of the radio unit has been adjusted by the attenuation-setting voltage generator 53f, this adjusted gain is not allowed to be reflected in the result of the comparison performed by the gain adjustment unit 66. The adjusted-gain cancellation means 72 is constituted by an arithmetic unit that corrects the detected power in the opposite direction by an amount equivalent to the adjusted gain.

There are cases where a transmission power amplifier is connected to the radio unit 53 and the transmission signal is power amplified by this amplifier and then broadcast from the antenna. The gain characteristic of this transmission power amplifier differs for each base-station transmitter. In order to accommodate for this difference in gain characteristics, the amount of attenuation applied by the variable attenuator 53e, namely the gain of the radio unit 53, is finely adjusted. If no measures whatsoever are taken, the transmitter gain stabilization unit 52 will operate so as to cancel out the change in gain due to such fine adjustment and the end result will be that the fine adjustment is nullified. Accordingly, the arithmetic unit 72 is provided and corrects the detected power value by the amount of the adjusted gain in a direction opposite the adjustment direction, thereby assuring that the fine adjustment will not be reflected in the results of the comparison. More specifically, if is assumed that the gain of the radio unit 53 is controlled by an attenuation setting voltage (logarithm) ΔV, then the arithmetic unit 72 will subtract ΔV from the output of the integrator 63.

Thus, the adjusted gain in the radio unit is not cancelled out by feedback control. Moreover, a fluctuation in gain caused by temperature change and change with time of the radio unit and by a difference in characteristics can be stabilized by feedback control.

Figure 7:
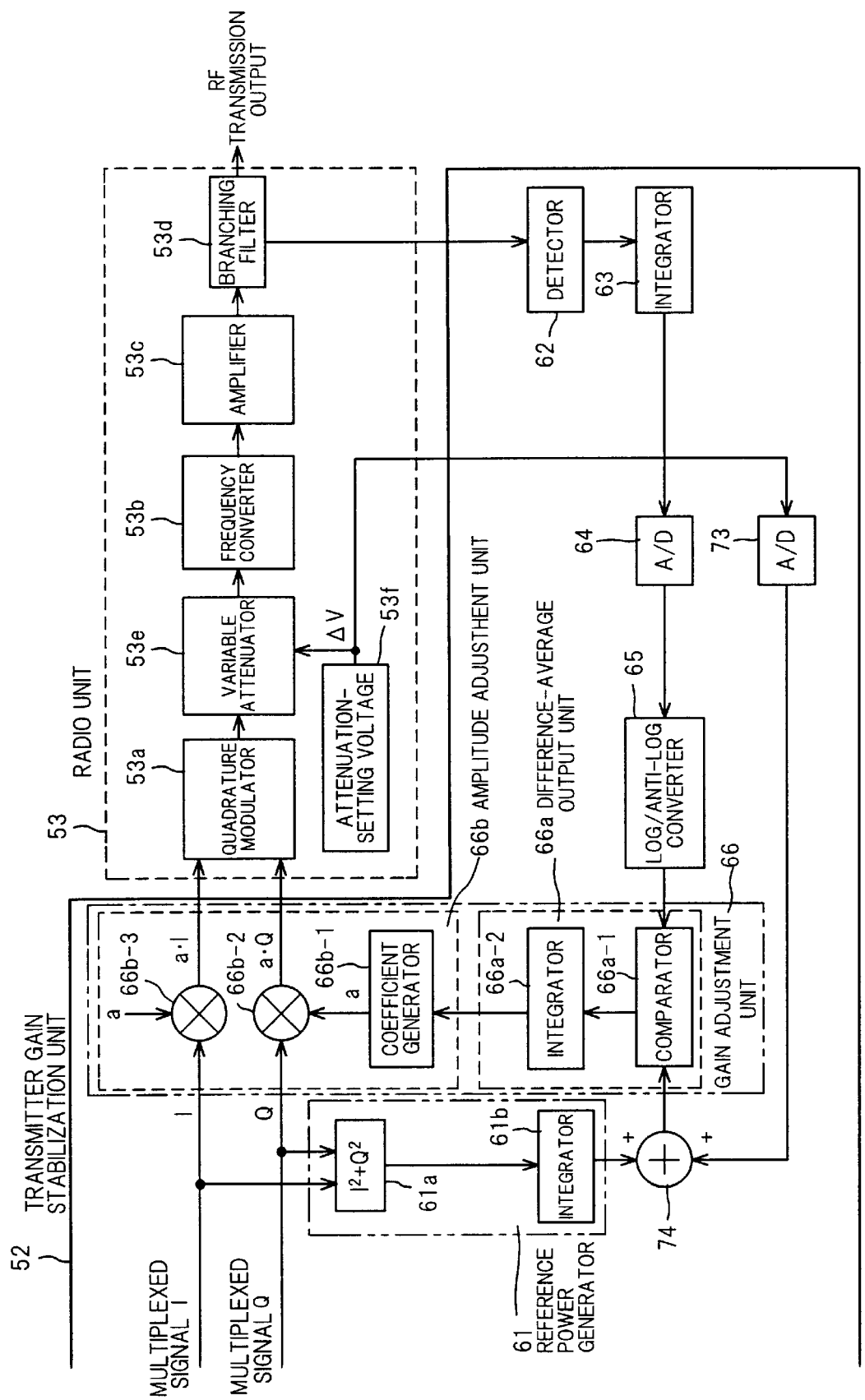
FIG. 7 is a block diagram showing a modification of a transmitter gain stabilization unit according to the third embodiment.

FIG. 7 illustrates a modification of the third embodiment, in which components identical with those of the embodiment of FIG. 6 are designated by like reference characters. This modification differs in that the reference power Pr, rather than the detected power Pt, is corrected in the same direction as the fine gain adjustment by an amount equivalent to the fine gain adjustment. That is, if it is assumed that the gain of the radio unit 53 is controlled by an attenuation setting voltage ΔV, then an arithmetic unit 74 will add this voltage to the output signal of the integrator 61b and deliver the result as the reference power value Pr.

(E) Fourth Embodiment

Figure 8:
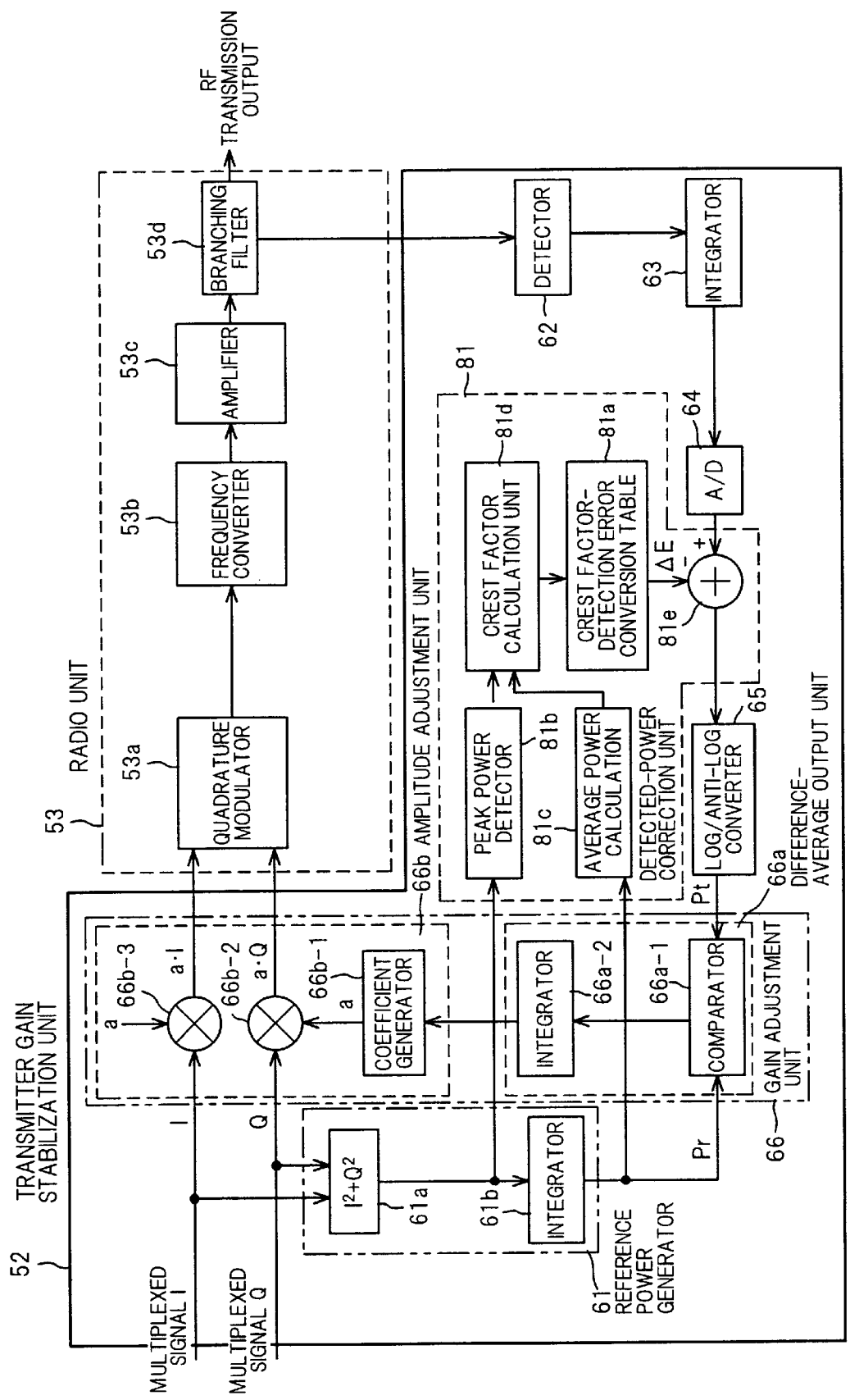
FIG. 8 is a block diagram showing the principal components of a CDMA transmitter having a transmitter gain stabilization unit according to a fourth embodiment.

FIG. 8 is a block diagram showing the principal components of a CDMA transmitter having a transmitter gain stabilization unit according to a fourth embodiment. Components in FIG. 8 identical with those shown in FIG. 2 are designated by like reference characters. This embodiment differs in that:

(1) there is provided a detected-power correction unit 81 for correcting an error, which is included in the detected power Pt, based upon average power value and peak power value of the baseband signal; and (2) the multiplexed signal generating unit 51 is shown in FIG. 8.

Figure 13:
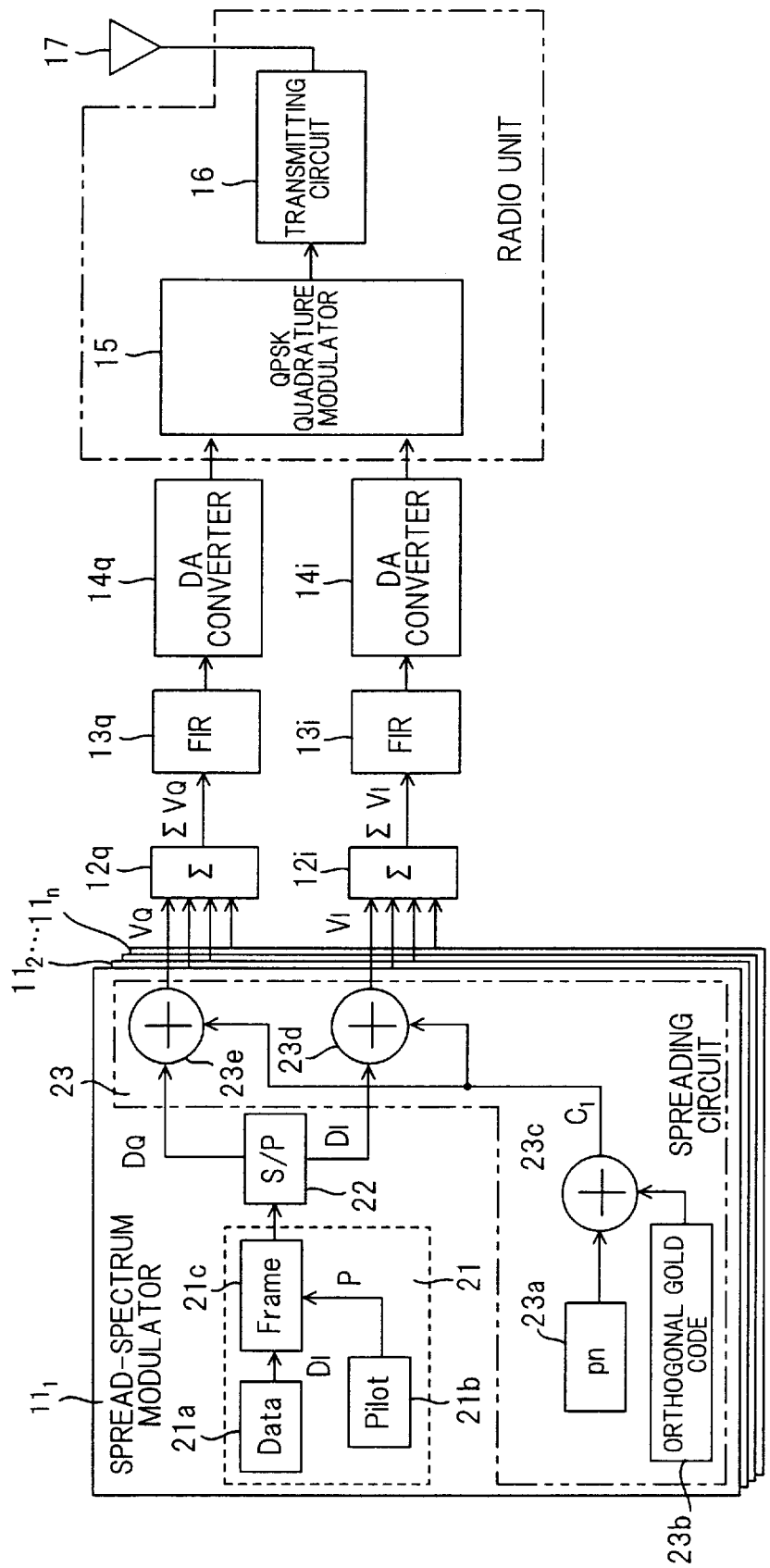
FIG. 13 is a block diagram showing the structure of a CDMA transmitter according to the prior art.
Figure 14:
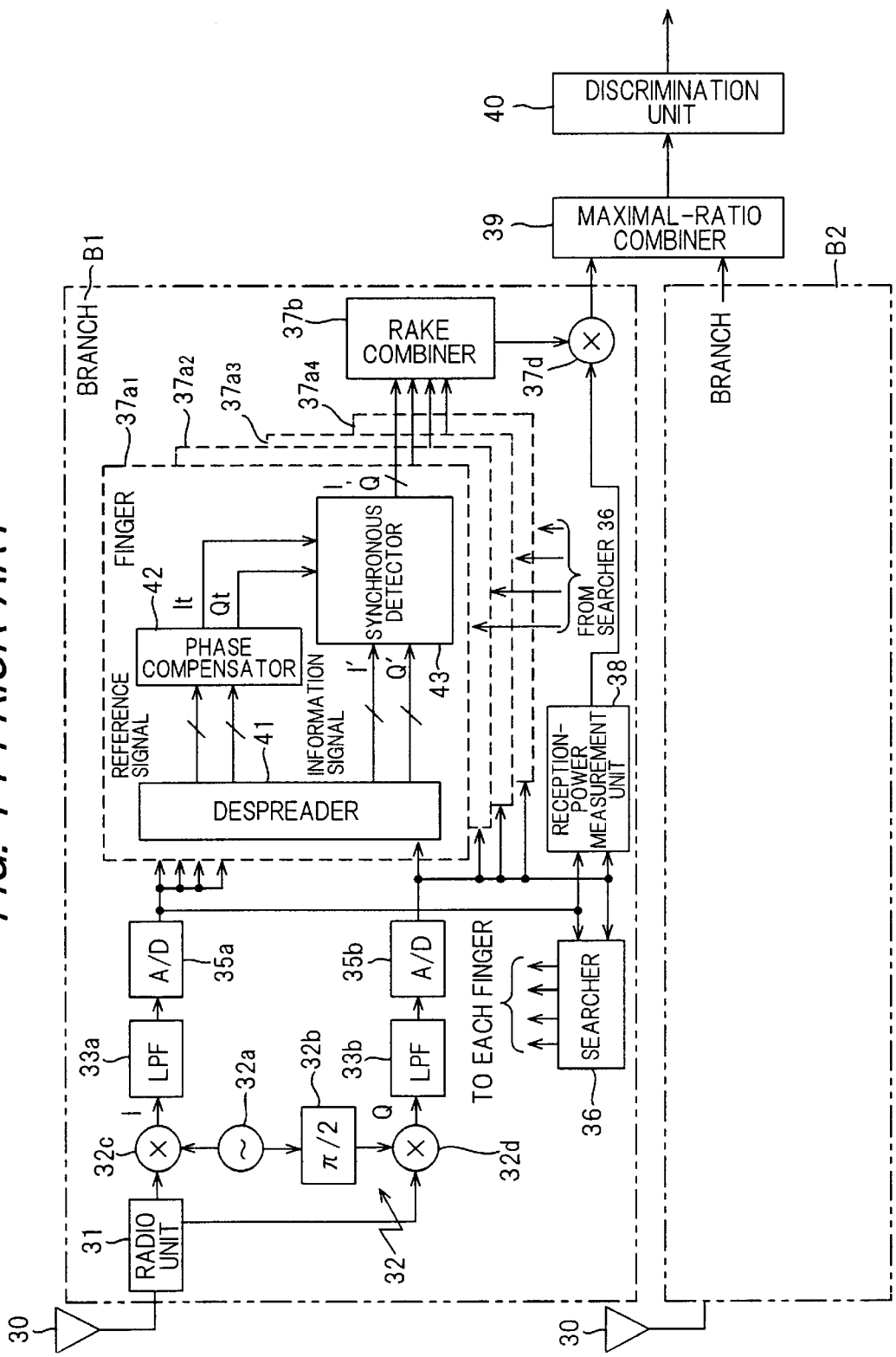
FIG. 14 is a block diagram showing the structure of a CDMA receiver composed of a plurality of branches according to the prior art.

The transmission baseband signal I+jQ is a code-multiplexed signal obtained by multiplying each user signal by an orthogonal code for identifying the user and then combining the signals (see FIG. 13). A high peak voltage is generated and the dynamic range of the detector input attains a value of 50 dB depending upon the phase relationship of each code and the number of multiplexed users. The detector 62 which handles this broad dynamic range cannot acquire the peak power correctly and an error is produced in the detector output as a result. The detection error depends upon the crest factor (the ratio of average power to peak power). Accordingly, in the fourth embodiment, the transmitter gain stabilization unit 52 is provided with the detected-power correction unit 81. The latter calculates the average power and peak power of the transmission signal, finds the crest factor from these power values and corrects the detection error based upon the crest factor.

More specifically, the apparatus measures the detection error of the detector 62 at each crest factor beforehand and saves the correspondence between crest factors and detection errors in a conversion table 81a. At the time of operation, a peak power detector 81b detects the peak power of the transmission baseband signal and an average power calculation unit 81c calculates the average power of the transmission baseband signal. A crest factor arithmetic unit 81d calculates the crest factor from peak power and average power, reads a detection error ΔE conforming to the crest factor out of the conversion table 81a and inputs the error ΔE to an arithmetic unit 81e. The latter subtracts the detection error ΔE from the detected power to correct the detected power.

Thus, in accordance with the fourth embodiment, detection error can be corrected in accordance with the crest factor and highly precise gain stabilization control can be carried out.

(F) Fifth Embodiment

Figure 9:
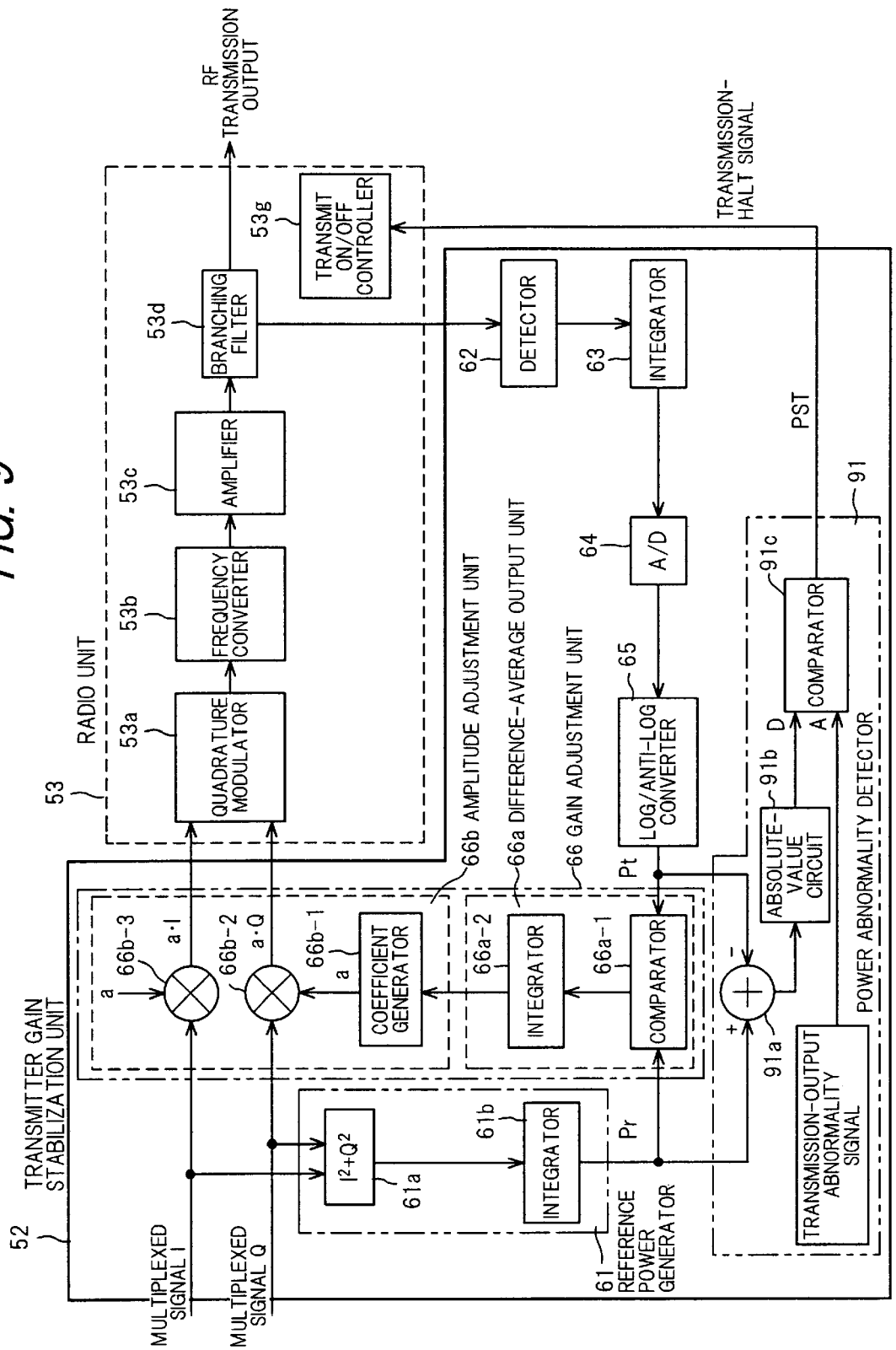
FIG. 9 is a block diagram showing the principal components of a CDMA transmitter having a transmitter gain stabilization unit according to a fifth embodiment.

FIG. 9 is a block diagram showing the principal components of a CDMA transmitter having a transmitter gain stabilization unit according to a fifth embodiment. Components in FIG. 9 identical with those of the first embodiment shown in FIG. 2 are designated by like reference characters. This embodiment differs in that:

(1) a power abnormality detector 91 is provided for detecting a transmission-power abnormality;

(2) the radio unit 53 is provided with a transmit on/off controller 53g for halting power transmission in response to a transmit-halt signal PST output from the power abnormality detector 91; and (3) the multiplexed signal generating unit 51 is not shown in FIG. 9.

The transmission power of a CDMA transmitter varies depending upon the number of users and transmission power of each user. As a consequence, whether or not an abnormality has developed in the transmission output cannot be determined merely by measuring the transmission power value. Accordingly, in the fifth embodiment, the power abnormality detector 91 is provided. The latter finds the difference between the reference power Pr and the detected transmission power (detected power) Pt and determines that the transmission output is abnormal when the difference exceeds a threshold value. More specifically, a difference calculation unit 91a calculates the difference between the reference power Pr and the detected transmission power (detected power) Pt, an absolute-value circuit 91b outputs the absolute value D of the calculated difference, and a comparator 91c compares the absolute value D of the difference with a threshold value A, which is regarded as a transmission-power abnormality. If D>A holds, the comparator 91c outputs the transmit-halt signal PST. If the transmit on/off controller 53g receives the transmit-halt signal PST as an input, the controller 53g halts the output of the transmission signal from the radio unit 53. In accordance with the fifth embodiment, a transmission-power abnormality can be detected reliably.

(G) Sixth Embodiment

Figure 10:
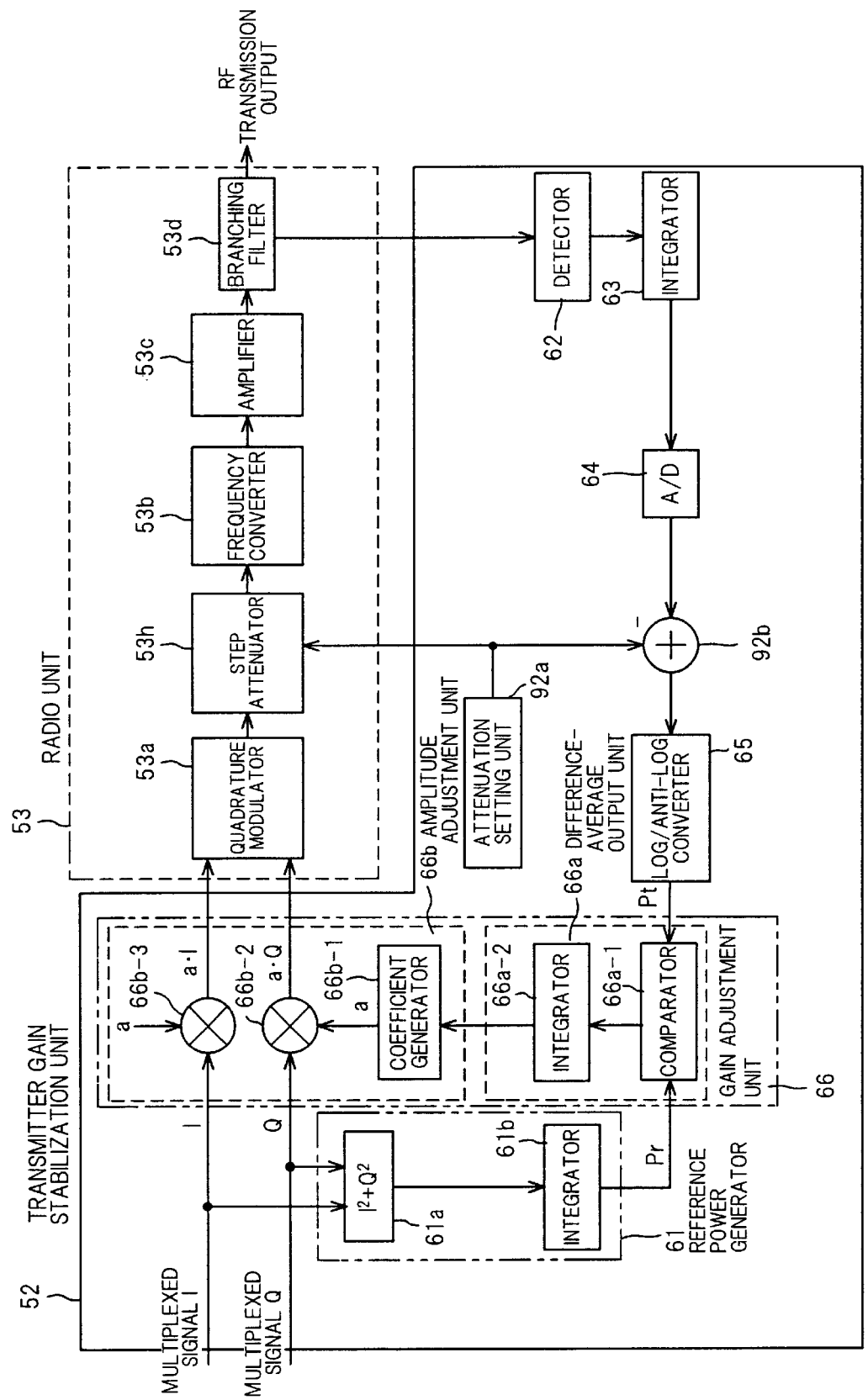
FIG. 10 is a block diagram showing the principal components of a CDMA transmitter having a transmitter gain stabilization unit according to a sixth embodiment.

FIG. 10 is a block diagram showing the principal components of a CDMA transmitter having a transmitter gain stabilization unit according to a sixth embodiment. Components in FIG. 10 identical with those of the first embodiment shown in FIG. 2 are designated by like reference characters. This embodiment differs in that:

(1) a step attenuator 53h is provided for controlling the amount of attenuation within the radio unit;

(2) an attenuation setting unit 92a is provided within the transmitter gain stabilizing unit for setting the amount of gain of the step attenuator 53h in the form of a digital value; and (3) an arithmetic unit 92b is provided so that when the amount of gain of the radio unit has been controlled by the step attenuator 53h, the amount of attenuation is not allowed to be reflected in the result of the comparison performed by the gain adjustment unit 66. The arithmetic unit 92b corrects the detected power Pr in the direction opposite the attenuating direction by an amount equivalent to the amount of attenuation.

It is required that a radio base station limit overall transmission power (transmission power after user multiplexing) depending upon the conditions of the environment where the base station has been installed. The limitation on power is performed by the step attenuator 53h based upon the amount attenuation that has been set as a logarithm in the attenuation setting unit 92a. In a case where such an arrangement for limiting overall transmission power is adopted, the dynamic range of the detector 62 is increased by an amount equivalent to the control range of the step attenuator 53h. Accordingly, the arithmetic unit 92b subtracts the setting value provided by the step attenuator 53h from the digital data obtained by the A/D conversion of transmission power after the transmission power is detected. As a result, processing executed by components from the log/anti-log converter 65 onward can be implemented independently of the setting value from the step attenuator 53h. This makes it possible to reduce the scale of the circuitry.

Figure 11:
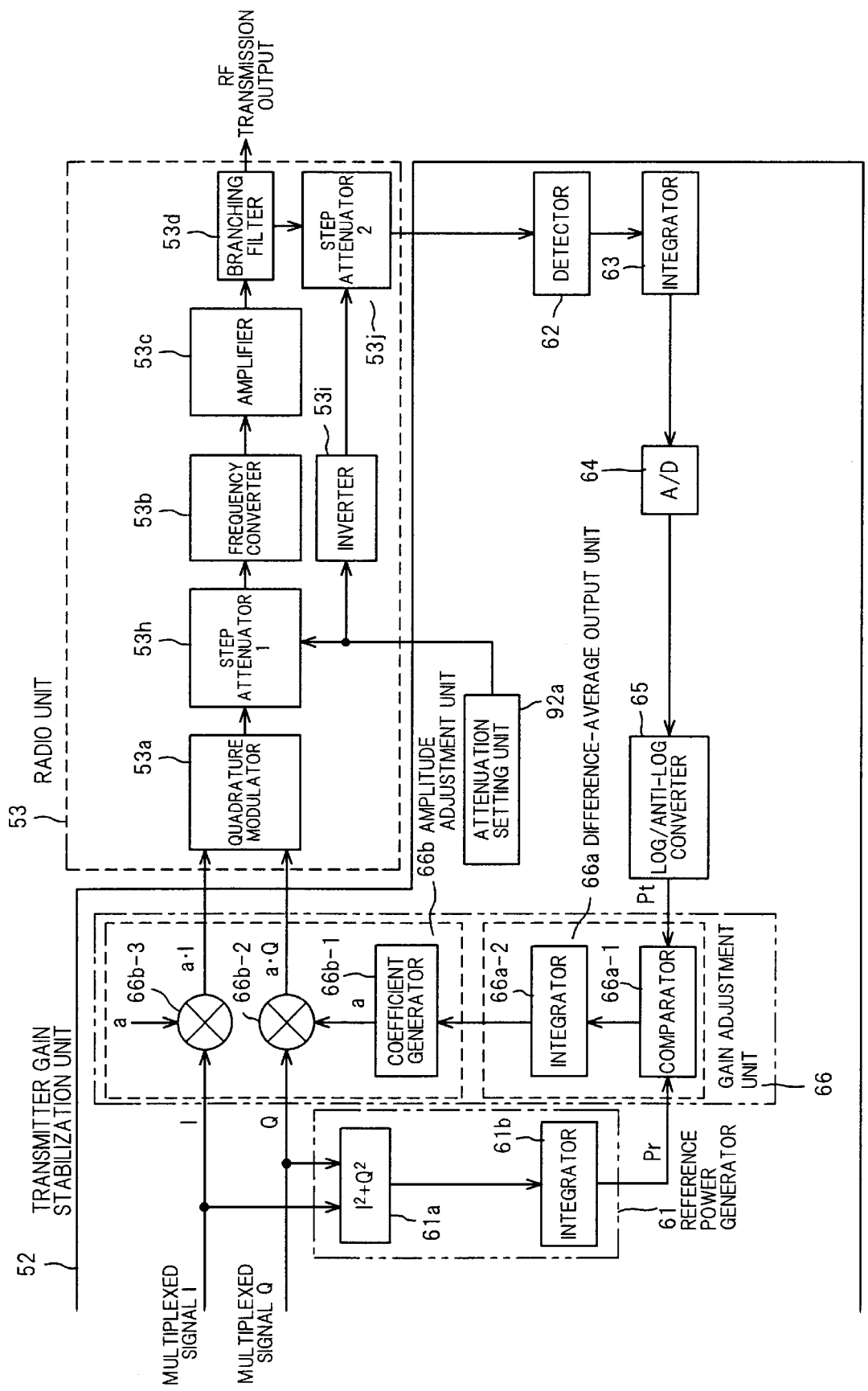
FIG. 11 is a block diagram showing a modification of the sixth embodiment.

FIG. 11 illustrates a modification of the sixth embodiment, in which components in FIG. 11 identical with those of the sixth embodiment shown in FIG. 10 are designated by like reference characters. This modification differs in that the arithmetic unit 92b is deleted and in that the radio unit 53 is internally provided with an inverter 53i and a second step attenuator 53j.

In a case where the overall transmission power is limited using the step attenuator 53h, the dynamic range of the detector 62 is increased by an amount equivalent to the control range of the step attenuator 53h as in the sixth embodiment. This extension of the dynamic range of the detector 62 causes a decline in the power detection precision. Accordingly, the second step attenuator 53j is disposed in front of the detector 62 to exercise gain control against that of the step attenuator 53h. For example, the overall amount of gain of the step attenuators 53h, 53j is made 10 dB and the attenuators are set to the values shown in FIG. 12. If this arrangement is adopted, the dynamic range of the detector 62 will no longer be affected by the step attenuator 53h and a limitation can be placed upon overall transmission power without detracting from the power detection precision.

Thus, in accordance with the present invention, the average power of a transmission baseband signal is adopted as reference power and the gain of a radio unit is adjusted in such a manner that the detected transmission power will agree with the reference power. As a result, the gain of the radio unit transmitter can be stabilized in highly precise fashion by feedback control. In addition, by averaging the power value of the transmission baseband signal and the detected transmission power value and the result of the power comparison, it can be so arranged that these will not follow up an increase or decrease in number of users and a variation in the transmission power of each user. This makes possible highly precise gain control.

Further, in accordance with the present invention, the average value of the baseband signal is compared with a set value and gain stabilization control is halted at the time of low-power transmission when the average power is smaller than the set value. This makes it possible to prevent a decline in precision of gain control while preventing an increase in the scale of the circuit.

Further, in accordance with the present invention, means is provided and operates, when the gain of the radio unit has been adjusted by a gain adjustment unit within the radio unit, to cancel out the adjusted gain so that it will not be reflected in feedback control. As a result, it is possible to correct a fluctuation in gain caused by differences in the gain characteristics of a transmission power amplifier connected to the radio unit and to correct a fluctuation in the gain of the radio unit ascribable to a temperature change and a change with the passage of time, thereby stabilizing the gain of the radio unit. Further, overall transmission power can be limited depending upon the environmental conditions where the base station is located, and a fluctuation in the gain of the radio unit ascribable to a temperature change and to a change with the passage of time can be corrected, thereby stabilizing the gain of the radio unit.

Further, in accordance with the present invention, detection errors conforming to combinations (crest factors) of average power values and peak power values are measured in advanced and stored in the form of a table. The average power value and peak power value of the baseband signal are detected, a detection error conforming to the detected average power value and peak power value are read out of the table and the detected power value is corrected based upon the detection error. As a result, detection error can be corrected in accordance with the crest factor and highly precise gain stabilization control can be carried out.

Further, in accordance with the present invention, a transmission-power abnormality signal is output in a case where a difference between reference power, which is the average power of the baseband signal, and detected power of the baseband signal is greater than a set level. As a result, even if the transmission power of a CDMA transmitted varies depending upon the number of users, etc., an abnormality in transmission output can be detected reliably.

As many apparently widely different embodiments of the present invention can be made without departing from the spirit and scope thereof, it is to be understood that the invention is not limited to the specific embodiments thereof except as defined in the appended claims.

What is claimed is:

1. An apparatus for stabilizing gain of a CDMA transmitter in a base station, comprising:
   first averaging means for outputting an average power value of a transmission baseband signal;
   a radio unit, to which the transmission baseband signal is input, for applying modulation, frequency conversion and high-frequency amplification to the baseband signal;
   a transmission power detector for detecting power of a transmission signal output from the radio unit;
   second averaging means for outputting an average value of the detected transmission power; and
   a first gain adjustment unit for comparing the average power of the baseband signal and the detected transmission power that have been output from the first and second averaging means, respectively, and adjusting the gain of the radio unit based upon the result of the comparison.

2. The apparatus according to claim 1, wherein said first gain adjustment unit includes:
   third averaging means for averaging a difference between power values output from said first and second averaging means; and
   an amplitude adjustment unit for adjusting an amplitude value of the transmission baseband signal based upon the difference average.

3. The apparatus according to claim 1, further comprising means for comparing the average power of the baseband signal with a set value and halting gain stabilization control when the average power is smaller than the set value.

4. The apparatus according to claim 1, wherein a second gain adjustment unit is provided within said radio unit, and said apparatus further comprises adjusted-gain cancellation means which, when the gain of said radio unit has been adjusted by said second gain adjustment unit provided, is for canceling the adjusted gain so that the adjusted gain will not be reflected in the result of the comparison performed by said first gain adjustment unit.

5. The apparatus according to claim 4, wherein said adjusted-gain cancellation means corrects said average value of the detected transmission power in an opposite direction by an amount equivalent to the adjusted gain or corrects said average power value of the baseband signal in the same direction by an amount equivalent to the adjusted gain.

6. The apparatus according to claim 1, further comprising transmission power correction means for correcting detection error of the transmission power, which has been detected by said transmission power detector, based upon the average power value and peak power value of the baseband signal.

7. The apparatus according to claim 6, wherein said transmission power correction means includes:
   a table for storing previously measured detection errors conforming to combinations of the average power values and peak power values of the baseband signal;
   a detector for detecting the average power value and peak power value of the baseband signal; and
   a correction unit for reading a detection error, which conforms to the detected average power value and peak power value of the baseband signal, out of said table and correcting the detected transmission power value based upon this detection error.

8. The apparatus according to claim 1, further comprising means for outputting a transmission-power abnormality signal in a case where a difference between the average power of the baseband signal and the detected transmission power is greater than a set level.

* * * * *